(12) United States Patent
Yen et al.

(10) Patent No.: US 7,192,845 B2
(45) Date of Patent: Mar. 20, 2007

(54) METHOD OF REDUCING ALIGNMENT MEASUREMENT ERRORS BETWEEN DEVICE LAYERS

(75) Inventors: Yu Lin Yen, Hsinchu (TW); Ching-Yu Chang, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 214 days.

(21) Appl. No.: 10/864,562

(22) Filed: Jun. 8, 2004

(65) Prior Publication Data
US 2005/0272221 A1   Dec. 8, 2005

(51) Int. Cl.
*H01L 21/76* (2006.01)
*H01L 21/78* (2006.01)
*H01L 21/46* (2006.01)
*H01L 23/544* (2006.01)

(52) U.S. Cl. .................. 438/462; 438/401; 438/975; 257/797; 257/E23.179

(58) Field of Classification Search ............. 438/462, 438/401, 975; 257/797, E23.179
See application file for complete search history.

(56) References Cited

U.S. PATENT DOCUMENTS

| | | | | |
|---|---|---|---|---|
| 6,049,137 A | * | 4/2000 | Jang et al. ............... | 257/797 |
| 6,057,206 A | * | 5/2000 | Nguyen et al. ............ | 438/401 |
| 6,136,662 A | * | 10/2000 | Allman et al. ............. | 438/401 |
| 6,352,904 B2 | * | 3/2002 | Tan et al. ................. | 438/401 |
| 6,440,816 B1 | * | 8/2002 | Farrow et al. ............. | 438/401 |
| 6,492,269 B1 | * | 12/2002 | Liu et al. .................. | 438/687 |
| 6,706,610 B2 | * | 3/2004 | Yoshimura et al. ......... | 438/401 |
| 6,888,260 B2 | * | 5/2005 | Carpi et al. ................ | 257/797 |
| 2002/0137303 A1 | * | 9/2002 | Byers et al. ............... | 438/401 |

* cited by examiner

*Primary Examiner*—Luan Thai
(74) *Attorney, Agent, or Firm*—Stout, Uxa, Buyan & Mullins, LLP (57) ABSTRACT

An integrated circuit in which measurement of the alignment between subsequent layers has less susceptibility to stress induced shift. A first layer of the structure has a first overlay mark. A second and/or a third layer are formed in the alignment structure and on the first layer. Portions of the second and/or third layer are selectively removed from regions in and around the first overlay mark. A second overlay mark is formed and aligned to the first overlay mark. The alignment between the second overlay mark and first overlay mark may be measured with an attenuated error due to reflection and refraction or due to an edge profile shift of the first overlay mark.

17 Claims, 7 Drawing Sheets

METHOD OF REDUCING ALIGNMENT MEASUREMENT ERRORS BETWEEN DEVICE LAYERS

BACKGROUND OF THE INVENTION

1. Field of the Invention

The present invention relates generally to integrated circuits and fabrication methods for integrated circuits and, more particularly, to methods of forming overlay alignment structures.

2. Description of Related Art

Since the introduction of semiconductors and fabrication processes for semiconductor devices and integrated circuitry, the density of devices and number of devices on a chip have increased at an exponential rate. With limited space on a semiconductor wafer, the trend has been to construct devices vertically through the use of alternating stacked layers of conductive and non-conductive materials. Layers are patterned through photolithographic processes before additional layers are deposited or grown. A photolithographic process can include depositing a photoresist on top of a layer, positioning a reticle mask (containing a pattern of opaque lines and regions on an otherwise transparent material) over the photoresist, and shining coherent or noncoherent light through the reticle mask onto the photoresist. The light cures the photoresist only where the photoresist is not shadowed by the reticle mask pattern. For positive photoresist any cured photoresist (e.g., the photoresist not shadowed by the reticle mask pattern) is then washed away, exposing regions of the uppermost layer to subsequent processes such as oxidation, metal deposition, and/or impurity doping. Finally, any uncured photoresist is then stripped away, and another photolithography process may begin with another material.

An industry trend toward smaller devices has exacerbated a need to align the subsequent reticle masks more precisely with the previous photolithographic step along the x-y plane as well as rotationally. If, for example, a semiconductor-layer step creates a transistor and then a subsequent metal-layer step is not aligned precisely, a vital connection between the transistor and a conductive path may not be formed.

To facilitate alignment, the first layer on a wafer generally contains a set of alignment marks, which are high precision features that are used to reference the first layer when positioning subsequent layers. Alignment marks are also included in other layers, as the original marks become difficult to align with during further processing. Many fabrication steps include creation of a vernier pattern or other alignment marks on both a reticle mask and the layer to which the reticle mask is to be aligned. Such alignment marks are not necessary for operation of the integrated circuit, but can allow improved alignment of the reticle masks with the substrate.

Vernier patterns are useful alignment structures that comprise a first layer of a plurality of equally spaced rectangles over which a second layer of equally spaced rectangles having a different spacing than the first layer of rectangles is formed. The first layer of rectangles is commonly formed of oxide during for example the field oxidation step. The second layer of rectangles can be formed of photoresist during a subsequent metal deposition step. If, for example, the spacing between the first plurality of rectangles is different than the spacing of the second plurality of rectangles by 0.1 µm, and the top center rectangle aligns to the bottom center rectangle, then perfect alignment is achieved. If however, the top rectangle fourth to the right of center aligns to the bottom rectangle fourth to the right of center, then there is an overlay offset of 0.4 µm in that direction, and the offset can be corrected accordingly.

Common practice is to optically align to the vernier and/or alignment marks through any previously deposited films. With this practice alignment can be difficult to achieve due to optical distortion from reflection and diffraction through the deposited material. The profile of the alignment marks can also change due to expansion or contraction of the deposition film during temperature changes.

Figure 1A:
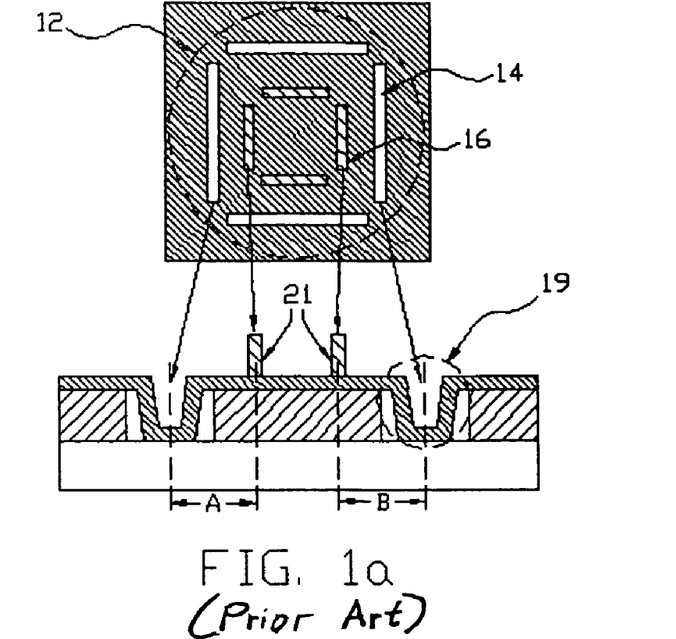
FIG. 1a shows a prior art representation of an ideal example of an alignment structure.
Figure 1B:
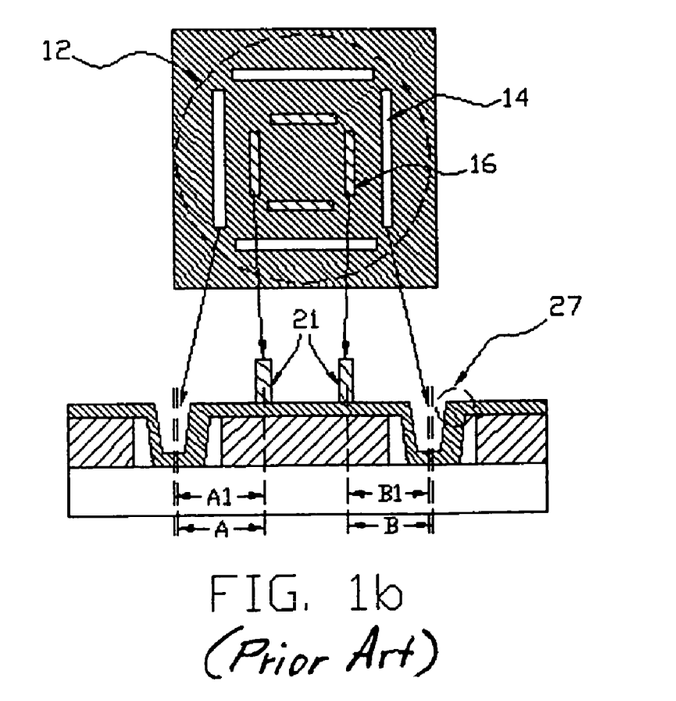
FIG. 1b shows a prior art representation of a real world example of an alignment structure.

FIGS. 1a and 1b illustrate a prior art alignment structure 12 comprising a first overlay mark 14 and a second overlay mark 16 in accordance with a theoretical ideal example and a real world example, respectively. It should be noted that FIGS. 1a and 1b illustrate both plan and cross-sectional views of the prior art alignment structure and that the scales for the plan and cross-sectional views are different. The first overlay mark 14 comprises a metal lined trench 19 and the second overlay mark 16 comprises a first patterned photoresist layer 21. In the stress free ideal condition of FIG. 1a the overlay separations, distance A and distance B, provide the real overlay value. An equal distance A and distance B means that the second overlay mark 16 and its accompanying layer have been correctly positioned. In the real world condition of FIG. 1b compressive and expansive stresses cause the edge profile 27 to shift. Changes in the edge profile 27 cause the first overlay mark 14 to be asymmetric which in turn causes false overlay separation readings of distance A1 and distance B1. In the situation of FIG. 1b the first overlay mark 14 and second overlay mark 16 are properly aligned, but a measurement of the overlay separations indicates that the two overlay marks are not properly aligned due to the edge profile shift. The edge profile shift can create false readings, making it difficult to ascertain actual alignment conditions.

As device dimensions become smaller, the attenuation of errors introduced by optically aligning through the deposition material becomes increasingly important. As such, there is introduced in the art a need to develop a process wherein optical distortion and stress induced measurement error is reduced or eliminated.

SUMMARY OF THE INVENTION

In accordance with one aspect of the present invention, at least one of the above shortcomings is addressed by providing a first layer comprising a first material, forming in a surface of the first layer at least one first overlay mark, forming a second layer comprising a second material in portions of the at least one first overlay mark, forming a third layer comprising a third material over the first and second layers, patterning the third layer such that the third layer is removed from regions in and around the at least one first overlay mark, and forming at least one second overlay mark. The provided process can allow proper angular relationship with respect to other features in the layer despite thermally-induced flexing of the substrate. An overlay mark near a periphery of the substrate (i.e., an outer overlay mark), can reflect a real or proper overlay condition in response to a reticle mask being aligned with the substrate.

The invention herein disclosed can allow and facilitate improved alignment of a reticle mask with a substrate by allowing a process engineer to determine whether the reticle mask "overlays" the substrate, i.e., by reflecting a real or proper overlay condition of a reticle mask with a substrate.

The reticle mask overlays the substrate when the reticle mask is positioned properly with respect to the substrate.

In accordance with one aspect of the present invention, the first layer may comprise an inter-layer dielectric. The inter-layer dielectric may comprise TEOS, BPSG, or a TEOS and BPSG complex. The first layer may also comprise silicon dioxide. The second layer may comprise a conductive material which may include tungsten (W).

In accordance with another aspect of the present invention, forming the second layer may comprise the steps of: forming a second layer over the first layer, and selectively removing the second layer such that it remains in portions of the at least one first overlay mark. The step of selectively removing the second layer may comprise chemical mechanical polishing (CMP) or etch back.

The third layer as set forth in the above process may comprise a conductive material. The conductive material may comprise copper and/or aluminum. Prior to the formation of the third layer, a glue layer may be formed, wherein the glue layer may comprise a ti-nitride (TiN)/titanium (Ti) complex such as TiN/Ti or Ti/TiN/Ti.

The at least one second overlay mark and at least one first overlay mark may be rectangular, circular, oval, or otherwise arbitrary in shape, and the at least one second overlay mark may be aligned to that at least one first overlay mark.

In one embodiment of the invention the forming of a second layer may be omitted. When the second layer is omitted, the third layer may comprise an oxide or SiN. In another embodiment of the invention the at least one first overlay mark may correspond to at least one first vernier layer, and the at least one second overlay mark may correspond to at least one second vernier layer. The at least one overlay mark may correspond to a plurality of first overlay marks, and the at least one second overlay mark may correspond to a plurality of second overlay marks.

Any feature or combination of features described herein are included within the scope of the present invention provided that the features included in any such combination are not mutually inconsistent as will be apparent from the context, this specification, and the knowledge of one of ordinary skill in the art. For purposes of summarizing the present invention, certain aspects, advantages and novel features of the present invention are described herein. Of course, it is to be understood that not necessarily all such aspects, advantages or features will be embodied in any particular embodiment of the present invention. Additional advantages and aspects of the present invention are apparent in the following detailed description and claims.

DETAILED DESCRIPTION OF THE PRESENTLY PREFERRED EMBODIMENTS

Reference will now be made in detail to the presently preferred embodiments of the invention, examples of which are illustrated in the accompanying drawings. Wherever possible, the same or similar reference numbers are used in the drawings and in the description to refer to the same or like parts. It should be noted that the drawings are in simplified form and are not to precise scale. In reference to the disclosure herein, for purposes of convenience and clarity only, directional terms, such as, top, bottom, left, right, up, down, over, above, below, beneath, rear, and front, are used with respect to the accompanying drawings. Such directional terms should not be construed to limit the scope of the invention in any manner.

Although the disclosure herein refers to certain illustrated embodiments, it is to be understood that these embodiments are presented by way of example and not by way of limitation. The intent of the following detailed description, although discussing exemplary embodiments, is to be construed to cover all modifications, alternatives, and equivalents of the embodiments as may fall within the spirit and scope of the invention as defined by the appended claims. It is to be understood and appreciated that the process steps and structures described herein do not cover a complete process flow for the manufacture of vernier structures or alignment marks. The present invention may be practiced in conjunction with various integrated circuit fabrication techniques that are conventionally used in the art, and only so much of the commonly practiced process steps are included herein as are necessary to provide an understanding of the present invention. The present invention has applicability in the field of semiconductor devices and processes in general. For illustrative purposes, however, the following description pertains to integrated circuit devices and methods of etching layers disposed on substrates of such devices.

Figure 2:
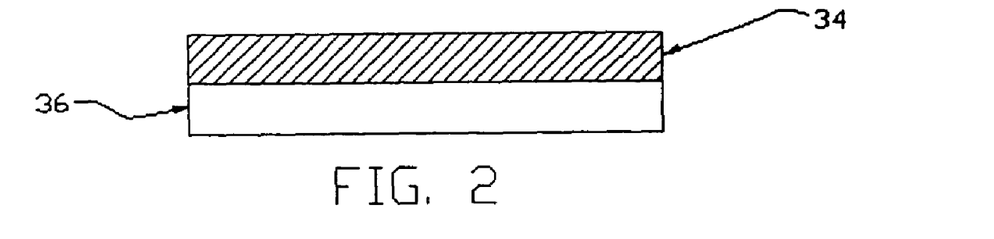
FIG. 2 shows a first layer disposed on a substrate in accordance with an embodiment of the present invention.

FIG. 2 shows a first layer 34 disposed on a substrate 36. The first layer 34 may comprise an inter-layer dielectric such as tetraethylorthosilicate (TEOS), borophosphosilicate glass (BPSG), or a TEOS and BPSG complex, and may be deposited or grown on the substrate in accordance with an exemplary embodiment of the present invention. Inter-layer dielectrics are used between metal layers, such as an underlying layer and second layer, to prevent inter-layer shorts. It should be appreciated that many integrated circuits, such as microprocessors and other devices commonly manufactured in the computer industry, can have six or more metal layers separated from one another by inter-layer dielectrics. In modified embodiments, first layer 34 may be a thick native silicon-dioxide layer that has been epitaxially grown directly on an amorphous silicon substrate and then planarized. The amorphous silicon substrate may have been doped to create semiconductor devices such as transistors and diodes. In modified embodiments, the first layer 34 can be any suitable dielectric or other insulator.

Figure 3:
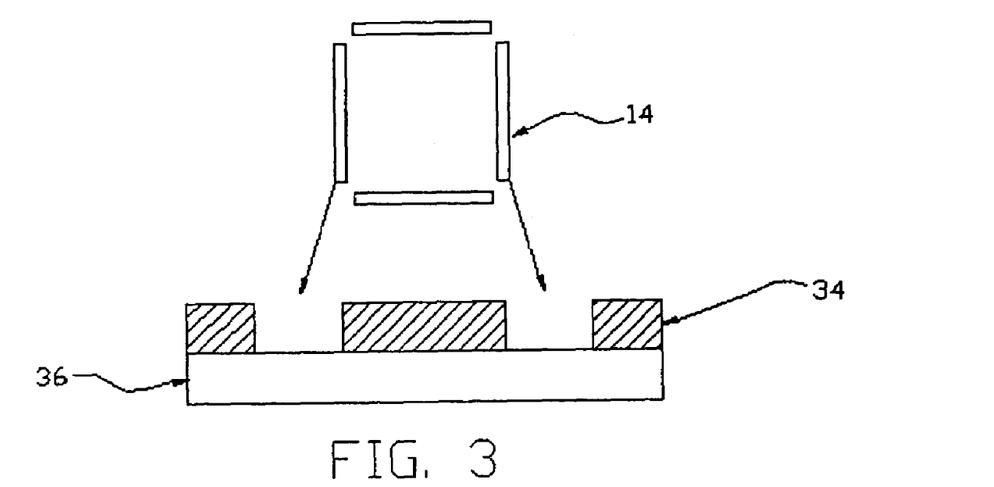
FIG. 3 shows a plan view and a cross sectional view of a first overlay mark formed in the first layer in accordance with an illustrated embodiment of the present invention.

FIG. 3 shows a first overlay mark 14 of an alignment structure. Note that FIGS. 3, 4, 6, 7, 8, and 9 illustrate plan and cross-sectional views of an alignment structure and that the scales of the plan and cross-sectional views are different. The first overlay mark 14 may be formed along a scribe line placed in conjunction with the formation of contact holes in a device region. The contact holes and the first overlay mark 14 may be formed, for example, by photolithographically etching an inter-layer dielectric. Photolithography and etching processes, which are well-understood in the art, are described below in the context of an exemplary embodiment in connection with the formation of the first overlay mark 14 and the corresponding contact holes in the first layer 34. An exemplary photolithographic technique includes covering the first layer 34 with a photoresist, aligning a reticle mask substantially parallel with and at a predetermined distance above the substrate, and generating light or other radiation (such as deep ultraviolet light or laser emission) at a location such that only the light or other radiation that has passed through the reticle mask may reach the substrate. Thus, the reticle mask is positioned between the substrate and a source of the light or other radiation, so that the reticle mask prevents the light or other radiation from curing the photoresist in some regions and allows the light or other radiation to cure the photoresist in other regions. For positive photoresist, the light (or other radiation) cures the photoresist where exposed. Any cured portions of the photoresist are washed away, exposing the first layer 34 where the photoresist has not been cured. An etcher then removes portions of the first layer 34 where the photoresist has been cured, leaving behind a first overlay mark 14 and, for example, at least one contact hole.

Figure 4:
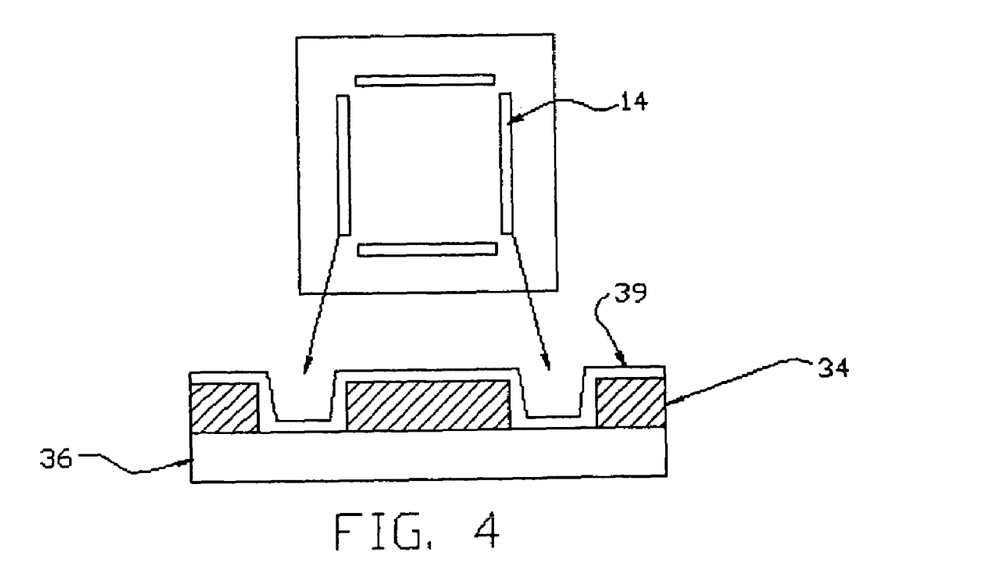
FIG. 4 shows a second layer disposed in the first overlay mark and on the first layer in accordance with an illustrated embodiment of the present invention.

FIG. 4 shows a deposition of a second layer 39. The second layer 39 has a second-layer feature that is located within the first overlay mark 14. To create the second layer 39, the substrate 36 and first layer 34 can be covered with a second material. For purposes of illustration, the second layer 39 is described as comprising tungsten (W). Tungsten is commonly used to fill interconnects such as contact holes and vias due to its superior ability to flow into narrow deep trenches and holes without leaving voids or air gaps. Such voids may cause shorts and or circuit failure when a device undergoes stress. It will, however, be appreciated that any metal or other electrical conductor, such as aluminum (Al) or copper (Cu), could function appropriately in accordance with the illustrated embodiment of the present invention.

Figure 5A:
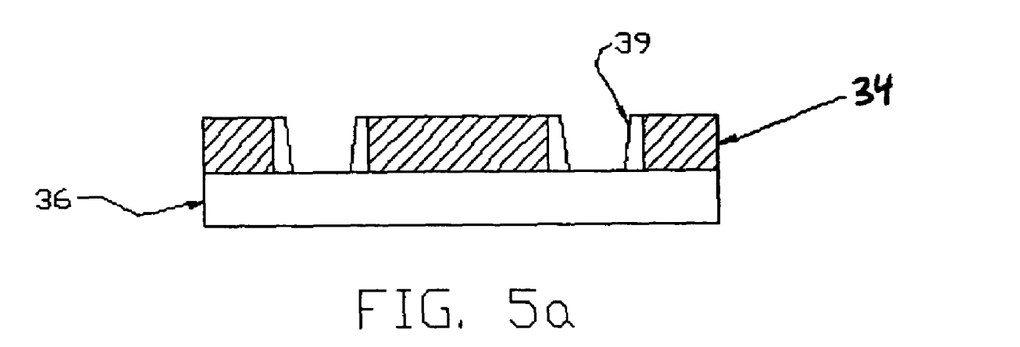
FIG. 5a shows the formation of FIG. 4, in which the second layer has been planarized by a wet or dry etch in accordance with an illustrated embodiment of the present invention.
Figure 5B:
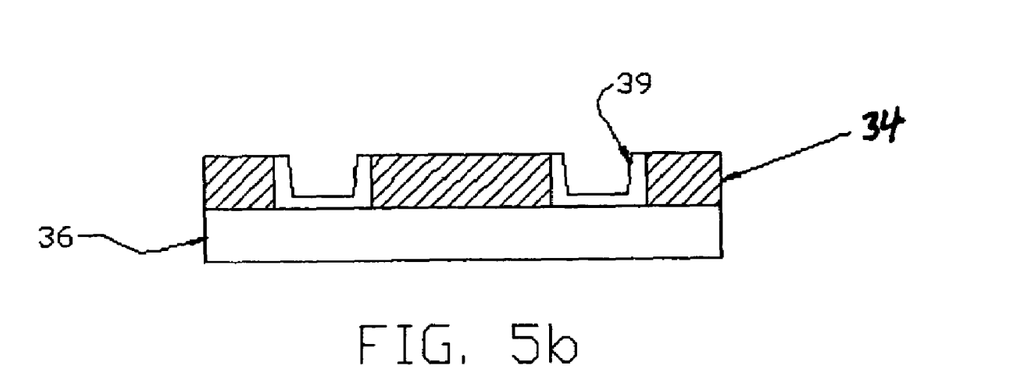
FIG. 5b shows the formation of FIG. 4, in which the second layer has been planarized by chemical mechanical polishing (CMP) in accordance with an illustrated embodiment of the present invention.

Sputtering or chemical-vapor deposition (CVD) can allow the tungsten to be deposited onto the substrate, and annealing (a heating process) can allow the tungsten to be infused into the first layer 34 and/or to flow more-or-less evenly across the substrate. The tungsten can then be planarized, for example, by chemical-mechanical polishing (CMP) or by etching back to remove the tungsten from the surface of the first layer 34. After planarization, the first overlay mark 14 thus contains a second-layer feature formed of tungsten, or other metal, of the second layer 39 as shown in FIGS. 5a and 5b. When an etch back process is performed as in FIG. 5a, the second layer 39 is removed from the bottom of the first overlay mark 14. The use of CMP as in FIG. 5b does not remove the second layer 39 from the bottom of the first overlay mark 14. In accordance with one aspect, the existence or lack of portions of the second layer 39 along the bottom of the first overlay mark 14 may not materially impact the functionality of the first overlay mark 14 as an alignment structure. For purposes of clarity, the following steps will be described assuming that an etch back process has been performed.

A subsequent deposition stage includes formation of a third layer 41, such as a sputtering of additional metal onto the substrate to form the third layer 41. For example, an aluminum layer may be sputtered onto the substrate. In a modified embodiment, another conductive material such as copper, for example, may be used instead of aluminum. At least some of the aluminum that is deposited falls into the first overlay mark 14 and forms a contact with the first layer 34 and the second layer 39 as shown in FIG. 6.

Prior to sputtering the aluminum onto the substrate 36 a glue layer may be deposited to augment bonding. Such glue layers may comprise, for example, ti-nitride (TiN)/titanium (Ti) complexes such as TiN/Ti or Ti/TiN/Ti. The improved adhesion can increase interface quality and may impact the diffusivity of the aluminum atoms at the interface, thus reducing electromagnetic resistance.

Figure 6:
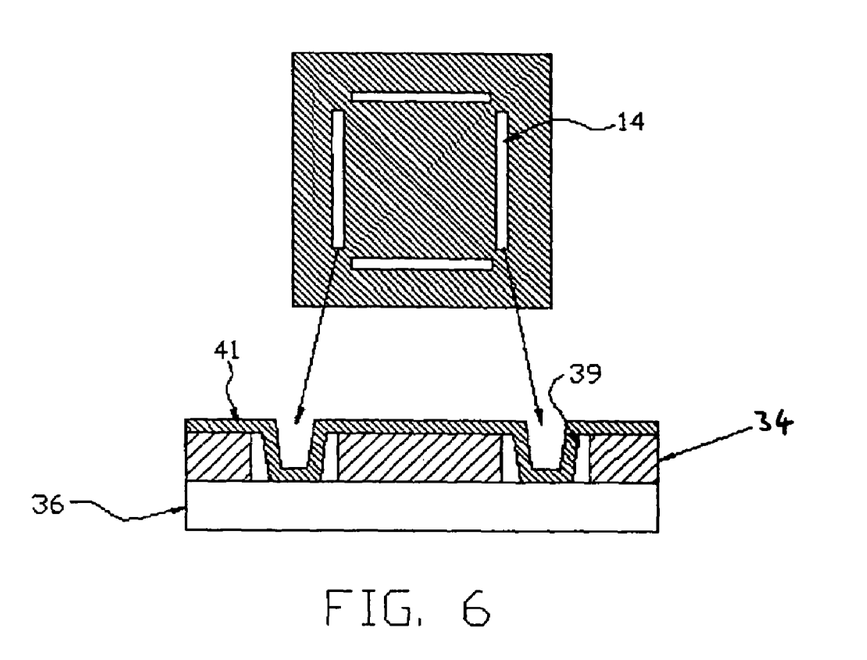
FIG. 6 shows a plan view and cross sectional view of the formation of FIG. 5a after the formation of a third layer in accordance with an illustrated embodiment of the present invention.
Figure 7:
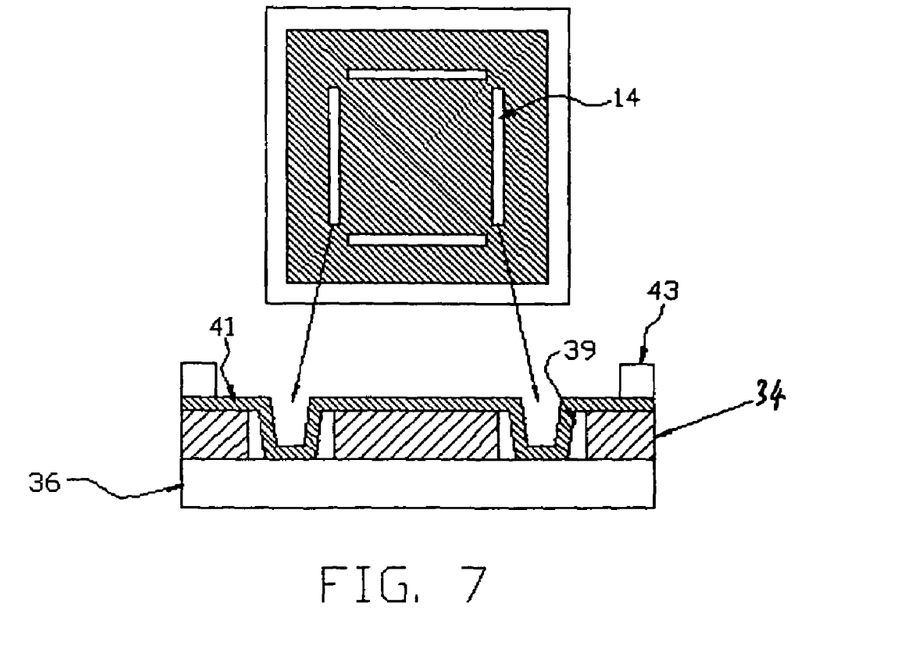
FIG. 7 shows the formation of FIG. 6 with the addition of a second patterned photoresist layer in accordance with an illustrated embodiment of the present invention.
Figure 8:
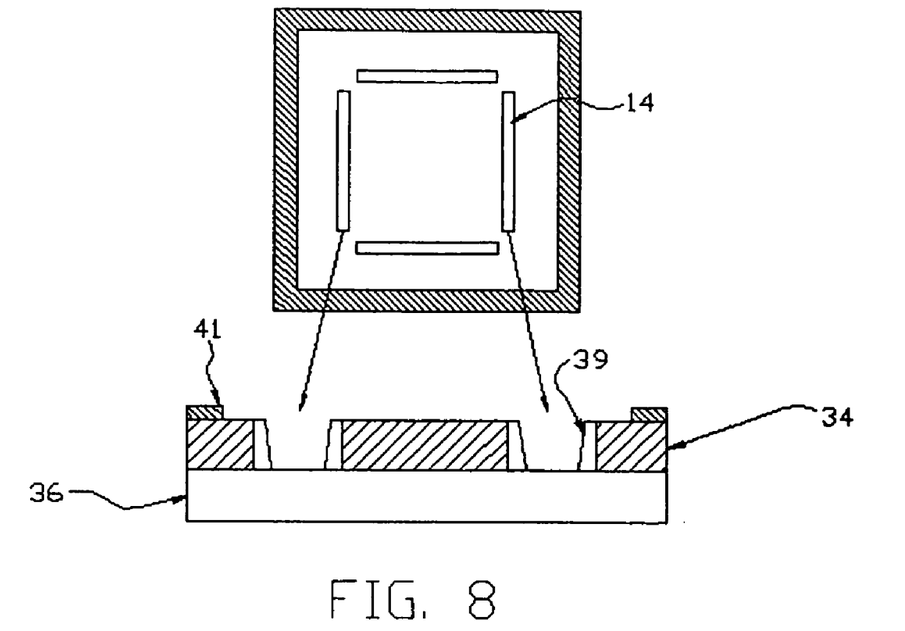
FIG. 8 shows the formation of FIG. 7 after the third layer has been etched and the second patterned photoresist layer has been removed in accordance with an illustrated embodiment of the present invention.

FIG. 7 illustrates a formation comprising the first overlay mark 14 of FIG. 6 with the addition of a second patterned photoresist layer 43. The photolithographic techniques that are used to pattern the second photoresist layer 43 can be similar to the photolithographic techniques that are used to pattern the first layer 34, but may differ in specific wavelengths and use different reticle masks, etchers and photoresists. Moreover, in accordance with one aspect of the present invention the subsequent reticle mask used in patterning the second photoresist layer 43 can be aligned with the first overlay mark 14 such that the first overlay mark 14 and a region surrounding it are left completely exposed. Aligning the reticle mask used in patterning the second photoresist layer 43 with the first overlay mark 14 can ensure that the third layer 41 is entirely removed from regions in and around the first overlay mark 14 during a subsequent dry or wet etch process. FIG. 8 shows the first overlay mark 14 after the third layer 41 has been etched and the second patterned photoresist layer 43 has been removed.

A third photoresist layer 45 (FIG. 9) can then be applied and patterned to form a second overlay mark 16 using similar photolithography steps to those implemented for the first and second photoresist layers. The reticle mask used to pattern the third photoresist layer can be aligned to the first overlay mark 14 to ensure that corresponding device structures such as contact holes are in physical and electrical contact and in alignment with predetermined features of device structures formed in previous layers.

Alignment with the first overlay mark 14 may be performed either manually or automatically. Manual alignment can entail use of a microscope through which an operator views both the reticle mask and the substrate. Either the reticle mask or the substrate is moved slightly, as necessary, until the reticle mask target is positioned directly over the substrate target. Automatic alignment mechanisms can reflect an incident light beam from the substrate, wherein various sharp edges of the features on the substrate, particularly sharp edges of substrate targets, refract the reflected light. An automatic mechanism can interpret the refraction pattern and move the substrate slightly, as necessary, until the reticle mask target is positioned directly over the substrate target. Laser interferometers, for example, can allow a stepper to control movement of the reticle mask.

Heating or annealing of the substrate, for example, may cause the third layer 41 and thus the first overlay mark 14 to undergo a profile shift. The profile shift may comprise, for example, flexing due to unequal thermal expansions of various components such as the first layer 34 and the third layer 41. The profile shift can undesirably move, for example, the third layer 41 or cause it to shift relative to the first layer 34. An example in which the first overlay mark 14 has undergone an edge profile change is described above in connection with FIG. 1b.

Figure 9:
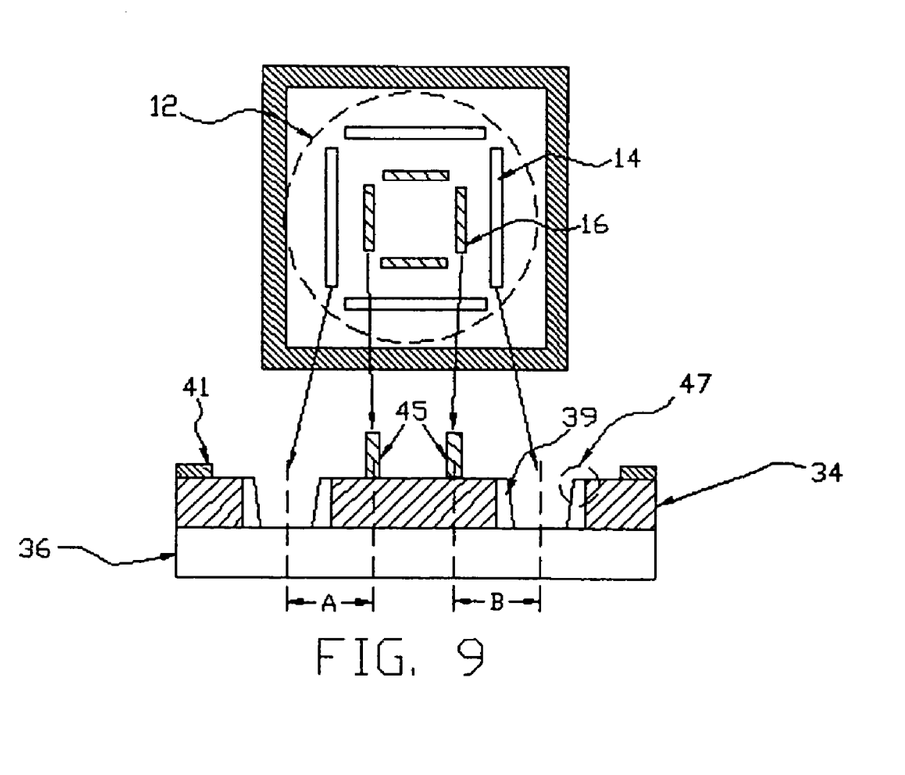
FIG. 9 shows the formation of FIG. 8 after a third photoresist layer has been applied and patterned to form the second overlay mark in accordance with an illustrated embodiment of the present invention.

In accordance with an embodiment of the present invention, FIG. 9 shows the substrate 36 after the third photoresist layer 45 has been patterned to form the second overlay mark 16. The alignment structure of FIG. 9 shows a profile that has not undergone a profile shift. In accordance with the illustrated embodiment of the present invention profile shifts can be prevented or attenuated, since the edge profile 47 of the first overlay mark 14 does not comprise the material of the third layer 41. Thus, as a result of the removal of the third layer 41 from a vicinity of the first overlay mark 14, the edge profile 47 is more likely to maintain a stable distance from the second overlay mark 16. In other words, as a result of the removal of the third layer 41 from a vicinity of the first overlay mark 14, a central region of the first overlay mark 14 remains at a distance A from a central region of the second overlay mark 16 and at a distance B from another central region of the second overlay mark 16 and/or tends not to shift as it would if portions of the third layer 41 were present.

Figure 10A:
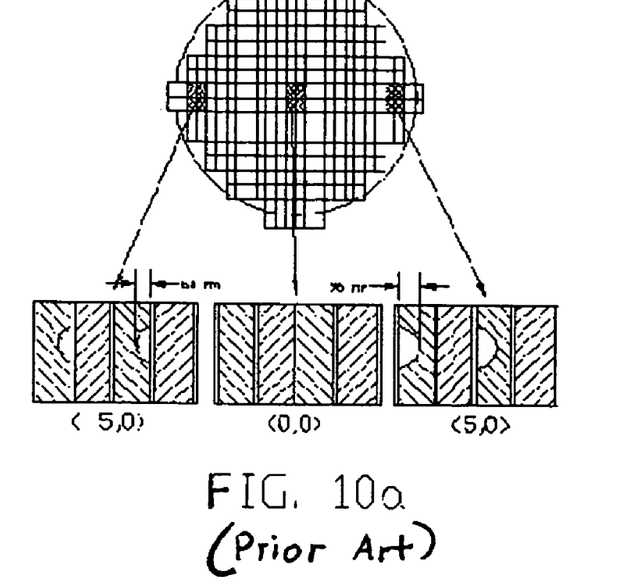
FIG. 10a shows the locations of a plurality of alignment structures disposed on a semiconductor wafer, and values of profile shifts at specified locations in accordance with the prior art.
Figure 10B:
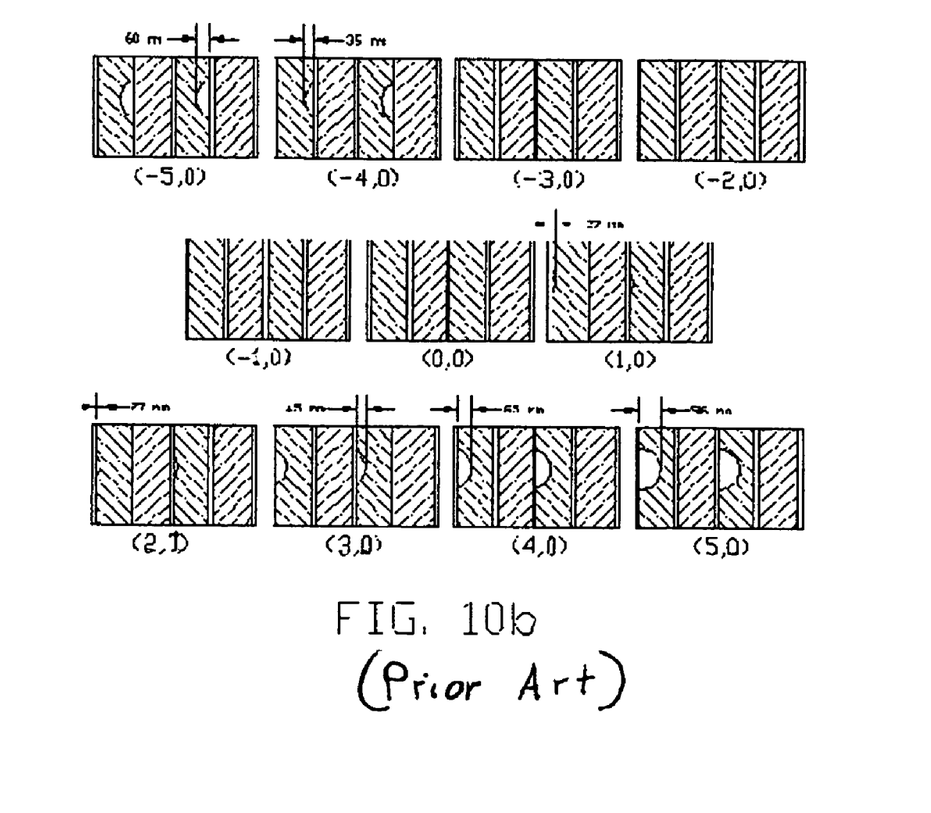
FIG. 10b shows more locations of a plurality of alignment structures disposed on a semiconductor wafer, and values of profile shifts at those locations in accordance with the prior art.

FIGS. 10a and 10b show locations of a plurality of alignment structures disposed on a semiconductor wafer and the values of profile shifts at those locations, in accordance with the prior art. Assuming that (0,0) is the Cartesian coordinate for the center of the wafer, alignment structures at coordinates (–5,0) through (5,0) are shown in expanded detail. As shown, there is no change in overlay at the wafer's center (0,0), but a trend of an increasing overlay change due to profile shifts progresses as measurements are taken further from the center.

At the center of the wafer, equal forces stress the alignment structures from all directions. As alignment structures are positioned away from the center, uneven forces affect them. The further from the center that an alignment structure is disposed, the greater the difference between the forces pulling toward the center of the wafer and the forces pulling toward the edge of the wafer, and thus the greater the profile shift. Profile changes are measured in nanometers and reflect the displacement in alignment at different positions on a wafer. The greater the displacement, the poorer the alignment between the first overlay mark 14 and the second overlay mark 16. The profile changes for the prior art alignment structures are 39 nm at (–4,0), 60 nm at (–5,0), 27 nm at (1,0), 27 nm at (2,0), 45 nm at (3,0), 65 nm at (4,0), and 96 nm at (5,0). Whereas no contact hole is visible at coordinate (0,0), the progressive profile shift causes shifts in the positions of contact holes in the example. These shifts are evident in FIG. 10b at coordinates (–5,0), (–4,0), (3,0), (4,0), and (5,0). Shifts in the positions of contact holes may cause problems by interfering with the formation of required conductive paths between layers of an integrated circuit.

Figure 11A:
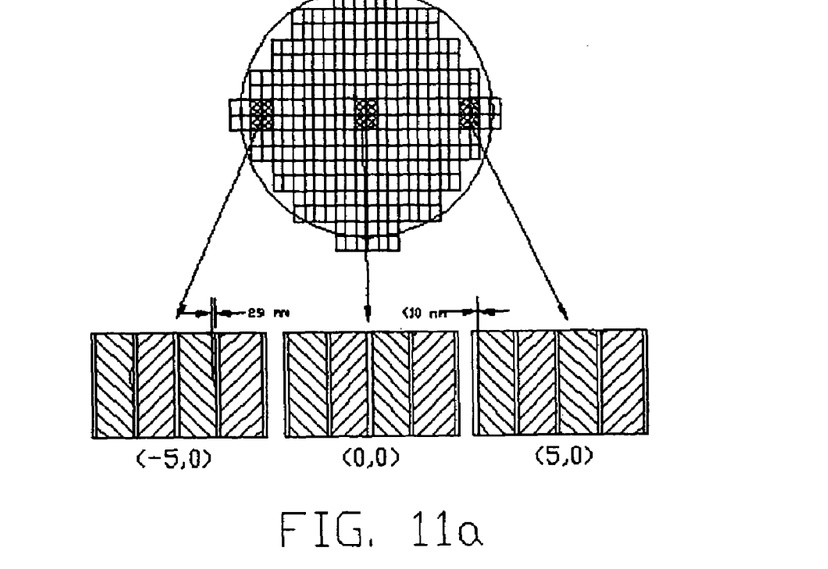
FIG. 11a shows the locations of a plurality of alignment structures disposed on a semiconductor wafer, and values of profile shifts at those locations in accordance with an illustrated embodiment of the present invention.
Figure 11B:
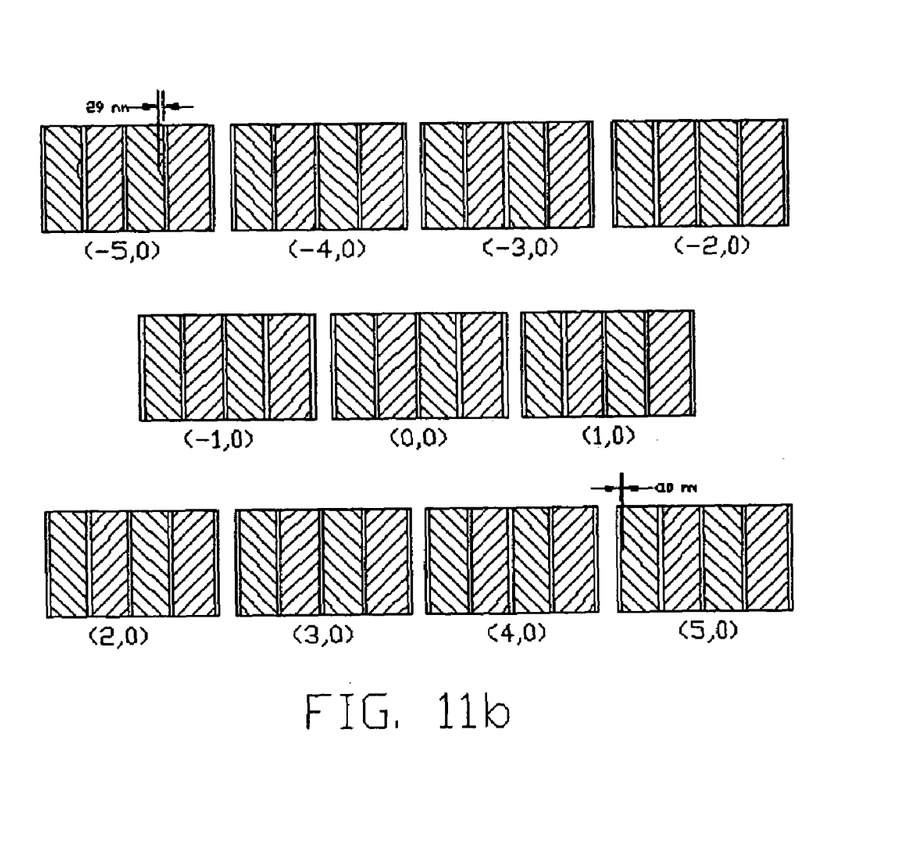
FIG. 11b shows more locations of a plurality of alignment structures disposed on a semiconductor wafer, and values of profile shifts at those locations in accordance with an illustrated embodiment of the present invention.

FIGS. 10a and 10b can be compared to corresponding data shown in FIGS. 11a and 11b, which reflect similar measurements taken from identical points on a semiconductor wafer that has been processed in accordance with an embodiment of the present invention. The overlay changes occurring in the alignment structures formed in accordance with an aspect of the present invention are 29 nm at (–5,0), <10 nm at (5,0), and not appreciable at (–4,0) through (4,0). These reduced overlay changes may not introduce as many visible shifts in contact holes compared to those illustrated in FIGS. 10a and 10b.

Although presently embodied as rectangular formations, the first overlay mark 14 and second overlay mark 16 can comprise other shapes, such as in one aspect arbitrary shapes including oval or circular formations. In an alternative embodiment, the second layer 39 may be omitted, and the third layer 41 may comprise, for example, an oxide or SiN. Process steps may remain unchanged, and reticle masks corresponding to various different material layers may be used such that the layers formed in the device region form, for example, a bit line or a word line structure.

In another alternative embodiment the first overlay mark corresponds to a first vernier layer, and the second overlay mark corresponds to a second vernier layer, such that when the first and second vernier layers are lined up the overlay offset may be determined.

In view of the foregoing, it will be understood by those skilled in the art that the methods of the present invention can facilitate formation of semiconductor device structures in an integrated circuit structure. The above-described embodiments have been provided by way of example, and the present invention is not limited to these examples. Multiple variations and modification to the disclosed embodiments will occur, to the extent not mutually exclusive, to those skilled in the art upon consideration of the foregoing description. Additionally, other combinations, omissions, substitutions and modifications will be apparent to the skilled artisan in view of the disclosure herein. Accordingly, the present invention is not intended to be limited by the disclosed embodiments, but is to be defined by reference to the appended claims.

What is claimed is:

1. A method of fabricating an integrated circuit, comprising:
   providing a first layer comprising a first material;
   forming in a surface of the first layer at least one first overlay mark;
   forming a second layer comprising a second material in portions of the at least one first overlay mark;
   forming another layer comprising another material over the first layer;
   patterning the other layer such that the other layer is removed from all regions in and around the at least one first overlay mark; and forming at least one second overlay mark on the first layer;
   wherein the at least one second overlay mark is aligned to the at least one first overlay mark.

2. The method of fabricating an integrated circuit as set forth in claim 1, wherein
the other layer is a third layer comprising a third material.

3. The method of fabricating an integrated circuit as set forth in claim 2, wherein the first layer comprises one of tetraethylorthosilicate (TEOS), borophosphosilicate glass (BPSG), and a TEOS and BPSG complex.

4. The method of fabricating an integrated circuit as set forth in claim 3, wherein the second material comprises tungsten (W).

5. The method of fabricating an integrated circuit as set forth in claim 2, wherein forming the second layer comprises:
forming a second layer over the first layer; and
selectively removing the second layer such that it remains in portions of the at least one first overlay mark.

6. The method of fabricating an integrated circuit as set forth in claim 5, wherein the selectively removing of the second layer is performed by chemical mechanical polishing (CMP).

7. The method of fabricating an integrated circuit as set forth in claim 5, wherein selectively removing the second layer is performed by wet or dry etch back.

8. A structure formed using the method of claim 5.

9. The method of fabricating an integrated circuit as set forth in claim 2, wherein the third layer comprises a conductive material.

10. The method of fabricating an integrated circuit as set forth in claim 8, wherein the conductive material comprises at least one of aluminum and copper.

11. The method of fabricating an integrated circuit as set forth in claim 9, wherein prior to the forming of a third layer a glue layer is formed.

12. The method of fabricating an integrated circuit as set forth in claim 2, wherein the at lest one first overlay mark and at least one second overlay mark are rectangular in shape.

13. The method of fabricating an integrated circuit as set forth in claim 2, wherein the at lest one first overlay mark and at least one second overlay mark comprise ovals shapes.

14. The method of fabricating an integrated circuit as set forth in claim 2, wherein the at least one first overlay mark corresponds to at least one first vernier layer, and the at least one second overlay mark corresponds to at least one second vernier layer.

15. The method of fabricating an integrated circuit as set forth in claim 2, wherein the at least one first overlay mark comprises a plurality of first overlay marks and the at least one second overlay mark comprises a plurality of second overlay marks.

16. A structure formed using the method of claim 2.

17. The method of fabricating an integrated circuit as set forth in claim 1, wherein the other layer comprises an oxide.

* * * * *